United States Patent [19]

Jung-Suk

[11] Patent Number: 5,389,557
[45] Date of Patent: Feb. 14, 1995

[54] PROCESS FOR FORMATION OF LDD TRANSISTOR, AND STRUCTURE THEREOF

[75] Inventor: Goo Jung-Suk, Seoul, Rep. of Korea

[73] Assignee: Goldstar Electron Co., Ltd., Chung-cheongbuk-Do, Rep. of Korea

[21] Appl. No.: 75,633

[22] Filed: Jun. 10, 1993

Related U.S. Application Data

[60] Division of Ser. No. 8,096, Jan. 22, 1993, Pat. No. 5,262,664, which is a continuation of Ser. No. 719,837, Jun. 24, 1991, abandoned.

[30] Foreign Application Priority Data

Jun. 30, 1990 [KR] Rep. of Korea ............. 90-9896

[51] Int. Cl.⁶ ..................................... H01L 21/265
[52] U.S. Cl. ..................................... 437/44; 437/909; 437/41
[58] Field of Search ................... 437/41, 44, 909; 257/336

[56] References Cited

U.S. PATENT DOCUMENTS 5,166,086  11/1992  Takada et al. ............. 437/41

FOREIGN PATENT DOCUMENTS 439173A    7/1991   European Pat. Off. ........ 437/44
298143A    4/1990   Japan .......................... 437/44
4219342A1 12/1992   Netherlands ................. 437/44

Primary Examiner—George Fourson
Assistant Examiner—Richard A. Booth
Attorney, Agent, or Firm—Blakely, Sokoloff, Taylor & Zafman

[57] ABSTRACT

A process for formation of an LDD transistor and a structure thereof are disclosed in which the junction capacitance and the body effect can be properly reduced. In the conventional LDD transistors, the punch-through problem is serious, and the improved conventional LDD transistor also, there is a limit in increasing the channel concentration, as well as the body effect being increased. The present invention gives solutions to the above problems by arranging that the junction thicknesses of n+ source and drain become smaller than the junction thicknesses of n− regions, and that a p type pocket 6 be formed only near a gate and a p type pocket 6.

5 Claims, 3 Drawing Sheets

PROCESS FOR FORMATION OF LDD TRANSISTOR, AND STRUCTURE THEREOF

This is a divisional of application Ser. No. 08/008,096, filed Jan. 22, 1993, now U.S. Pat. No. 5,262,664, which is a continuation of Ser. No. 07/719,837, filed Jun. 24, 1991, now abandoned.

FIELD OF THE INVENTION

The present invention relates to a process for formation of an LDD transistor and a structure thereof, and particularly to a process for formation of an LDD transistor and a structure thereof, in which the body effect and the junction capacitance can be suitably reduced.

BACKGROUND OF THE INVENTION

The structures of the conventional LDD transistors are illustrated in FIGS. 1 and 2. The LDD transistor of FIG. 1 is manufactured in the manner described below. That is, a gate oxide layer 3 is grown on a p type substrate 1, and then, a gate 4 is formed by depositing polysilicon. Then a p type pocket 6 and an n− region 7 are formed by ion-implanting boron and phosphorous respectively, and then, a side wall spacer 11 is formed by performing a reactive ion etching after depositing a low temperature oxide layer. Then arsenic (As) is ion-implanted to form an n+ region 8, thereby forming an LDD transistor.

Meanwhile, the LDD transistor of FIG. 2 is manufactured in the manner described below. That is, boron ions are implanted using a mask only into the portion of a channel 12 of a p type substrate 1, and then, a gate oxide layer 3 is grown on the substrate 1. Then a gate 4 is formed by despositing polysilicon, and then, an n− region 6 is formed by ion-implanting phosphorus. Then a side wall spacer 11 is formed by carrying out a reactive ion etching after depositing a low temperature oxide layer, and then, arsenic (As) is ion-implanted to form an n+ region 8, thereby forming an LDD transistor.

In the LDD transistors manufactured in the manners described above, while the sizes of the transistors are reduced, the problem of the punch-through becomes serious. In an attempt to overcome this problem, a p type pocketing is provided or the concentration of the channel 12 is increased on the source and drain regions 7,8. However, in the case where p type pocketings are provided to the source and drain regions, there arises the problem that the junction capacitance between the n+ region and the p type substrate is increased due to the existance of the p type pocket 6.

Meanwhile, in the case where the concentration of the channel is increased, there is a limit in the threshold voltage Vt, and therefore, there is a limit in increasing the channel concentration. Further, even if the threshold voltage Vt is maintained at a proper level, there is the problem that the body effect (the variation of Vt due to the back bias) is increased.

SUMMARY OF THE INVENTION

Therefore it is the object of the present invention to provide a process for formation of an LDD transistor and a structure thereof, in which all the above described disadvantages are solved.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
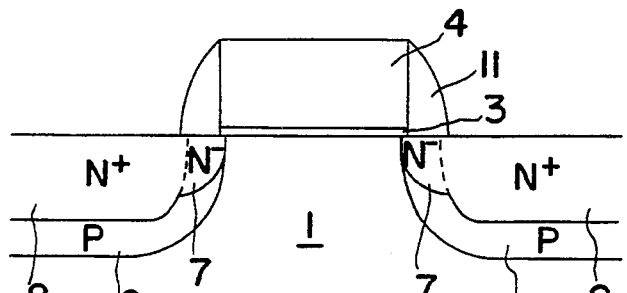
FIGS. 1 and 2 illustrate the structures of the conventional LDD transistors.
Figure 2:
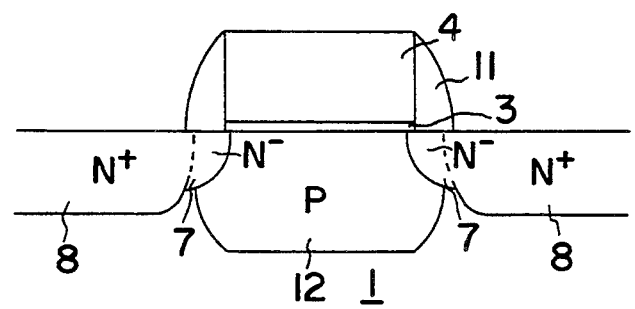
Figure 3A:
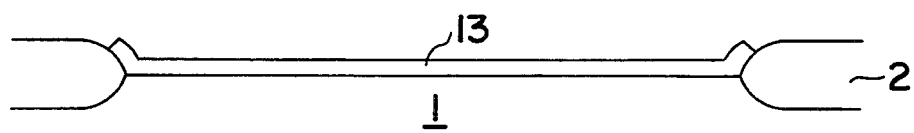
FIGS. 3A to 3G illustrate the process for the formation of the LDD transistor according to the present invention.
Figure 3B:
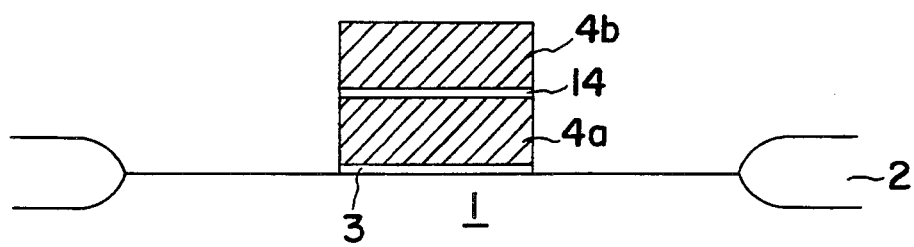
Figure 3C:
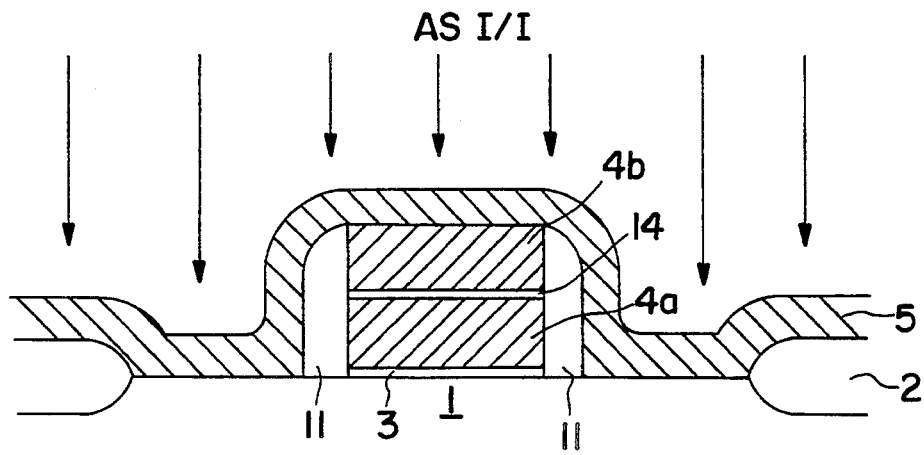

As shown in FIG. 3A, a nitride layer 13 is deposited on a p type substrate 1, and then, a field oxide layer 2 is formed after carrying out an etching using a mask on the portion of the nitride layer 13 where the field oxide layer is to be formed. Then as shown in FIG. 3B, a gate oxide layer 3 is grown after removing the nitride layer 13, and then, a polycrystalline silicon layer 4a, a nitride layer 14 and a polycrystalline silicon layer 4b are successively deposited on the gate oxide layer 3, with a gate being formed by applying a mask thereafter. Then, as shown in FIG. 3C, a side wall spacer 11 is formed, an undoped polycrystalline layer 5 is deposited thereupon, and then, an impurity (an element having a valence value 5 such as arsenic or phosphorus) is ion-implanted.

Figure 3D:
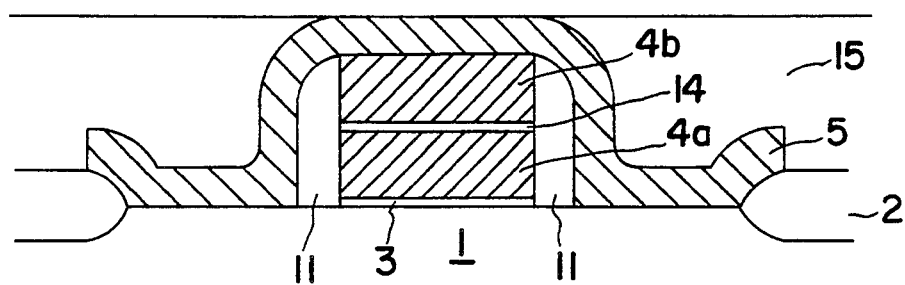
Figure 3E:
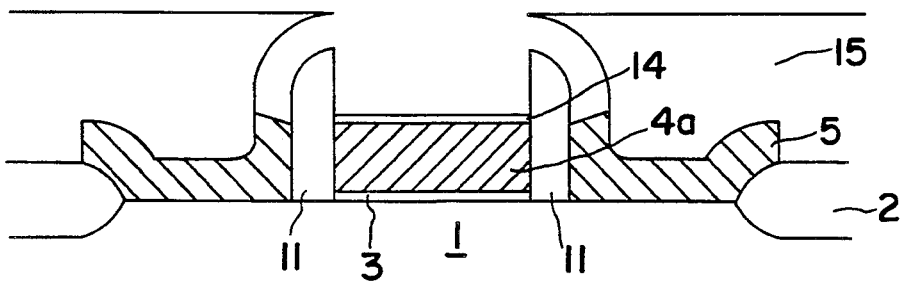
Figure 3F:
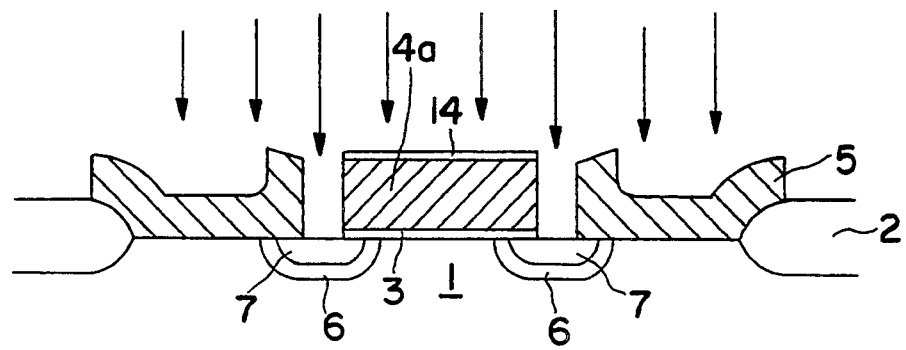
Figure 3G:
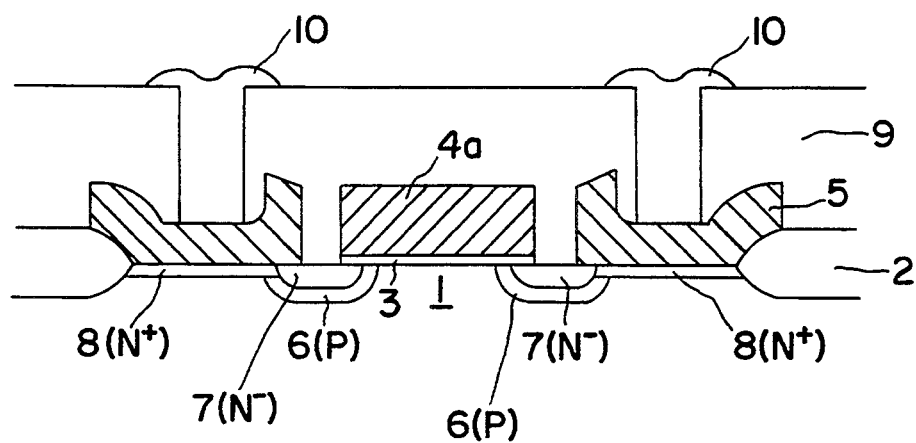

Then as shown in FIG. 3D, the polycrystalline silicon layer 5 is sheared off using a mask except a part of it positioned upon the gate and field oxide layer 2. Then a photoresist 15 is spread, and then, a flattening is carried out by performing an etch-back until the polycrystalline silicon layer 5 is exposed. As shown in FIG. 3E, the polycrystalline silicon layers 4b and 5 are etched in a stepped-up selection rate until the nitride layer 14 is exposed. As shown in FIG. 3F, the side wall spacer 11 is etched, and the photoresist 15 is removed. Further, a p type pocket 6 is formed by ion-implanting an impurity (an element having a valence value 3 such as boron or BF2) into the portion where the side wall spacer 11 was positioned, and then, an n− region 7 is formed by ion-implanting an impurity (an element having a valence value 5 such as arsenic or phosphorus). Then as shown in FIG. 3G, an insulating layer (SOG,BPSG) 9 is filled, and a finishing treatment is performed, thereby forming an n+ region 8 having a shallow impurity region diffused from the polycrystalline silicon layer 5.

Then, a contact is drilled, and a metal 10 is deposited. Then, interconnections are carried out, thereby forming an LDD transistor.

In the LDD transistor formed through the process described above, the high concentration p type portion exists only near the gate which is the end portion of the source and drain. Therefore, the junction capacitances of the source and drain as well as the body effect can be reduced, thereby improving the operating characteristics of the transistor, and also improving the chip speed.

What is claimed is:

1. A process for formation of an LDD transistor, comprising the steps of:

forming a field oxide layer, growing a gate oxide layer, and successively depositing a polycrystalline silicon layer 4a, a nitride layer 14 and a polycrystalline silicon layer 4b to form a gate; wherein said gate is spaced from said field oxide regions forming a side wall spacer 11 adjacent to and abutting the gate, depositing an undoped polycrystalline silicon layer 5 over the gate, the field oxide layer, and the space in between the gate and the field oxide layer, and ion-implanting a first impurity in the polycrystalline silicon layer 5;

shearing off said polycrystalline silicon layer 5 using a mask and excluding a part of said polycrystalline silicon layer 5 positioned upon said field oxide layers, spreading a photoresist 15 over said polycrystalline silicon layer 5, carrying out an etch back until said polycrystalline silicon layer 5 is exposed, and carrying out an etching on said polycrystalline silicon layers 4b, 5 until said nitride layer 14 is exposed;

etching off said side wall spacer 11, removing said photoresist 15, ion-implanting a second impurity in order to form a p type region 6 only on the portion where said side wall spacer 11 was located and ion-implanting a third impurity in order to form an n-type region 7 within a portion of said p type region 6;

filling an insulating material over the gate, the field oxide layer, and the space in between the gate and the field oxide layer, after carrying out the above steps, and performing a heat treatment to form a shallow n+ region 8 by the first impurity having diffused from said doped polycrystalline silicon layer 5; and etching said insulating material to create contact holes in said insulating material, depositing a metal 10, and forming electrical interconnections.

2. The process for formation of an LDD transistor as claimed in claim 1, wherein the first impurity consists of phosporus (P).

3. The process for formation of an LDD transistor as claimed in claim 1, wherein the first impurity consists of arsenic (As).

4. The process for formation of an LDD transistor as claimed in claim 1, wherein the second impurity consists of boron (B).

5. The process for formation of an LDD transistor as claimed in claim 1, wherein the second impurity consists of $BF_2$.

* * * * *